United States Patent
Liu et al.

(10) Patent No.: US 7,026,216 B2
(45) Date of Patent: Apr. 11, 2006

(54) METHOD FOR FABRICATING NITRIDE READ-ONLY MEMORY

(75) Inventors: Cheng-Jye Liu, Taoyuan Hsien (TW); Tai-Liang Hsiung, Hsinchu (TW); Chia-Hsing Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 44 days.

(21) Appl. No.: 10/065,750

(22) Filed: Nov. 15, 2002

(65) Prior Publication Data

US 2004/0097045 A1   May 20, 2004

(51) Int. Cl.
H01L 21/8234 (2006.01)
H01L 21/336 (2006.01)
H01L 21/8238 (2006.01)
H01L 21/3205 (2006.01)

(52) U.S. Cl. .................. 438/275; 438/257; 438/216; 438/591

(58) Field of Classification Search ................ 438/257, 438/258, 259, 260, 261, 262, 526, 275, 294, 438/216, 591, 527, 287, 954
See application file for complete search history.

(56) References Cited

U.S. PATENT DOCUMENTS

| 6,376,341 B1 * | 4/2002 | Kluth et al. ............... 438/510 |
| 6,436,778 B1 * | 8/2002 | Fang et al. ................ 438/305 |
| 6,538,270 B1 * | 3/2003 | Randolph et al. .......... 257/208 |

OTHER PUBLICATIONS

Wolf et al., Silicon Processing for the VLSI Era, 1986, Lattice Press, vol. 1, pp. 532-534.*

* cited by examiner

*Primary Examiner*—Chuong Anh Luu
(74) *Attorney, Agent, or Firm*—Jiang Chyun IP Office

(57) ABSTRACT

A method for fabricating a nitride read-only memory is described. An ONO stacked layer and a protective layer are sequentially formed on a substrate. A patterning/etching process is performed to pattern the protective layer and the ONO stacked layer to expose a portion of the substrate. Thereafter, the protective layer is removed by using wet etching. An ion implantation is performed to form buried bit lines in the exposed substrate, and then an insulator is formed on each buried bit line. A plurality of word lines are formed on the substrate crossing over the buried bit lines.

10 Claims, 3 Drawing Sheets

METHOD FOR FABRICATING NITRIDE READ-ONLY MEMORY

BACKGROUND OF INVENTION

1. Field of Invention

The present invention relates to a method for fabricating a read-only memory (ROM). More particularly, the present invention relates to a method for fabricating a nitride read-only memory.

2. Description of Related Art

A method for fabricating a nitride read-only memory in the prior art is described as follows. An oxide/nitride/oxide (ONO) stacked charge-trapping layer is formed on a substrate, and then patterned into a plurality of ONO strips. An ion implantation is performed to form doped regions in the exposed substrate serving as buried bit lines. An isolating oxide layer is formed on each doped region, and then a plurality of polysilicon word lines are formed on the substrate crossing over the ONO strips.

In the prior art, the ONO stacked layer is patterned with a patterned photoresist layer as an etching mask. However, as shown in FIG. 1, when the bottom oxide layer of the ONO stacked layer 108 is being etched, the top oxide layer 106 is etched simultaneously to cause corner loss or even corner indents. Therefore, the electrical properties around the edges of the ONO stacked layer 108 are changed, which may result in severe problems.

To prevent the problems caused by corner loss or corner indents, a method is provided in the prior art that increases the thickness of the top oxide layer to reduce the degree of the influence of corner loss or corner indents. However, an increased thickness of the top oxide layer does not meet the requirements for device miniaturization.

SUMMARY OF INVENTION

Accordingly, this invention provides a method for fabricating a nitride read-only memory to prevent over-etching of the top oxide layer, so as to reduce corner loss of the ONO stacked layer. It is thereby possible to prevent the electrical properties of the device from being deteriorated, as well as to meet the requirements for device miniaturization because the thickness of the top oxide layer needs not to be increased.

A method for fabricating a nitride read-only memory of this invention comprises the following steps. An ONO stacked layer and a protective layer are sequentially formed on a substrate, wherein the protective layer comprises a material different from silicon oxide, such as silicon nitride. An etching process is performed to pattern the protective layer and the ONO stacked layer to expose a portion of the substrate, wherein the etching rate of the protective layer is lower than that of the top oxide layer. Thereafter, the protective layer is removed by using wet etching. An ion implantation is performed to form buried bit lines in the exposed substrate, and then an insulator is formed on each buried bit line. A plurality of word lines are formed on the substrate crossing over the buried bit lines.

In another method for fabricating a nitride read-only memory of this invention, the protective layer on the ONO stacked layer is not removed after the ONO stacked layer are patterned. The protective layer comprises a material different from silicon oxide, such as silicon nitride, and has a thickness smaller than 50 Å, for example.

Since the protective layer having a lower etching rate is formed on the ONO stacked layer to protect the top oxide layer, corner loss of the top oxide layer can be reduced and the electrical properties of the device are not deteriorated.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 2A~2E schematically illustrate a process flow of fabricating a nitride read-only memory according to the preferred embodiment of this invention.

Figure 1:
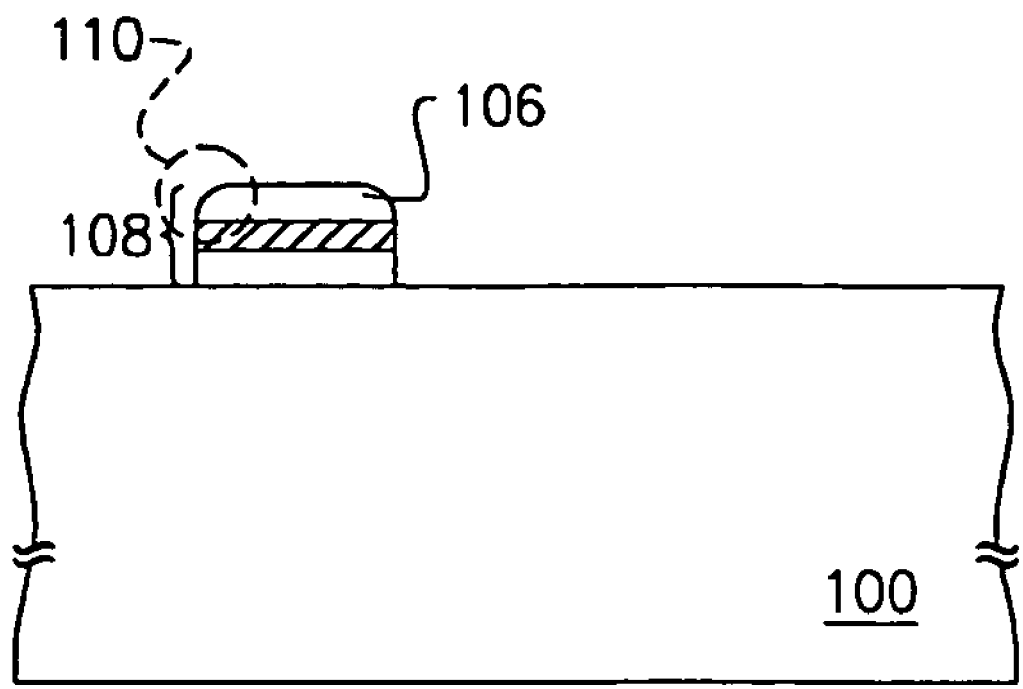
FIG. 1 shows the corner indents of a top oxide layer in a nitride read-only memory in the prior art.
Figure 2A:
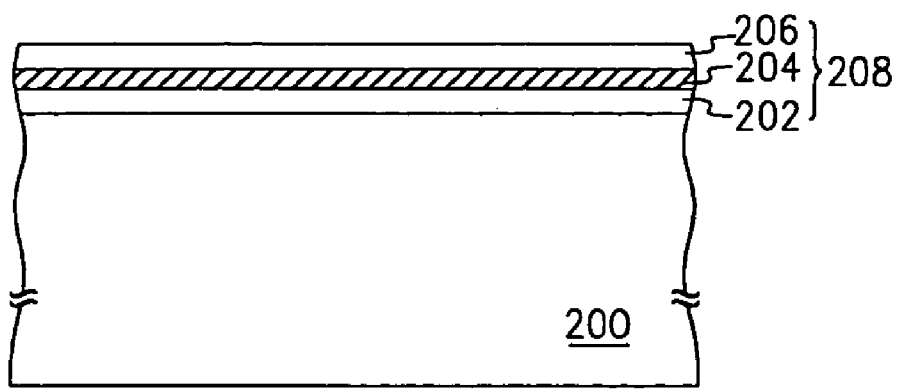
FIGS. 2A~2E schematically illustrate a process flow of fabricating a nitride read-only memory according to a preferred embodiment of this invention.

Refer to FIG. 2A, an ONO stacked layer 208, which consists of a bottom oxide layer 202, a silicon nitride layer 204 and a top oxide layer 206, is formed on a substrate 200. The bottom oxide layer 202, the silicon nitride layer 204 and the bottom oxide layer 206 have thickness of 50~100 Å, 55~80 Å and 70~120 Å, respectively.

Figure 2B:
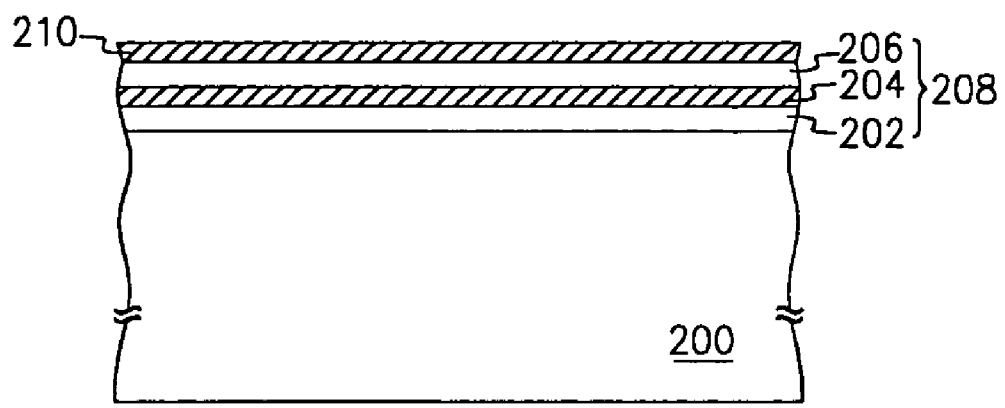

Refer to FIG. 2B, a protective layer 210 is formed on the ONO stacked layer 208. The protective layer 210 comprises a material different from silicon oxide, such as silicon nitride, and has a thickness smaller than 50 Å.

Figure 2C:
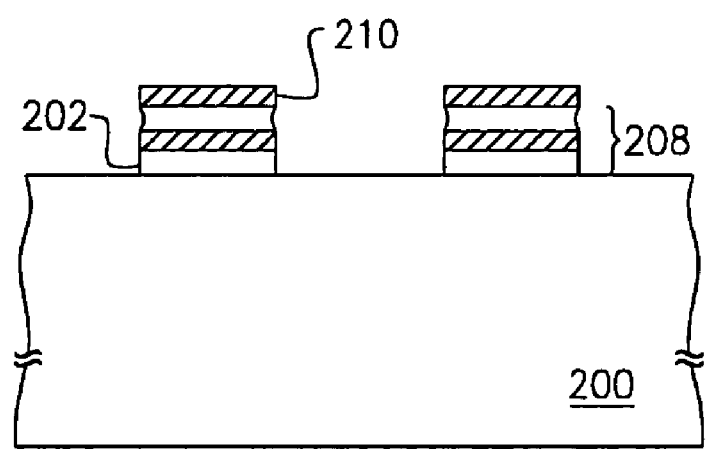

Refer to FIG. 2C, a lithography process and an etching process are performed to pattern the protective layer 210 and the ONO stacked layer 208 to expose a portion of the substrate 200, wherein the etching rate of the protective layer 210 is lower than that of the top oxide layer 202. Alternatively, the bottom oxide layer 202 is not patterned in the etching process in order to prevent channeling effect in the subsequent implantation process.

Figure 2D:
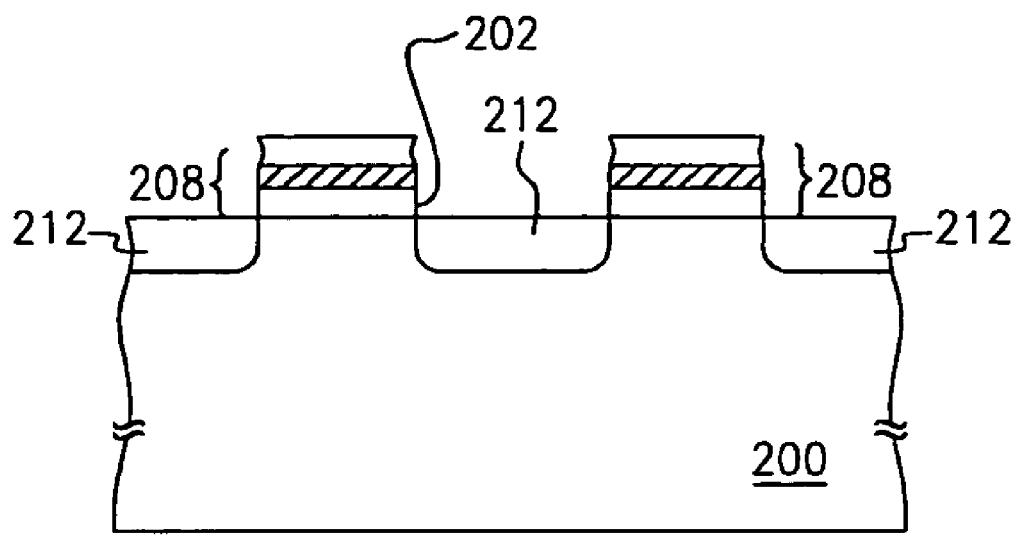

Refer to FIG. 2D, the protective layer 210 is removed by using wet etching. An ion implantation is then conducted to form buried bit lines 212 in the substrate 200 exposed by the patterned ONO stacked layer 208. However, the wet etching process can be omitted optionally to leave the protective layer 210 on the ONO stacked layer 208. Moreover, if the bottom oxide layer 202 has not been patterned in the previous patterning process, the exposed portions thereof should be removed subsequently.

Figure 2E:
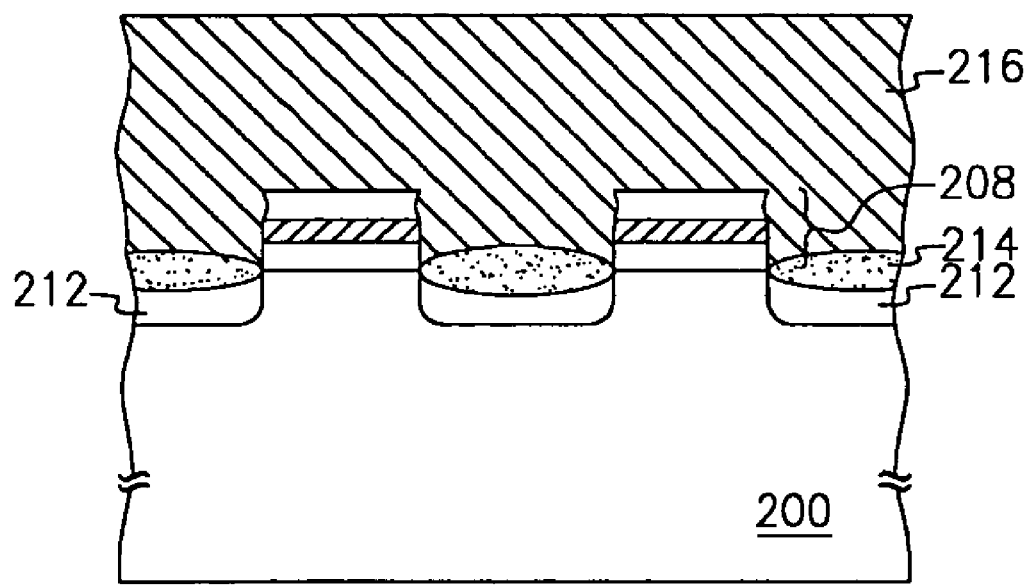

Refer to FIG. 2E, an insulator 214 is formed on each buried bit line 212, comprising a material such as silicon oxide formed by using thermal oxidation. A conductive layer, such as a polysilicon layer, is formed on the substrate 200 and then patterned into a word line 216.

Since the protective layer having a lower etching rate is formed on the ONO stacked layer to protect the top oxide layer, corner loss of the top oxide layer can be reduced and the electrical properties of the device are not deteriorated. Meanwhile, there is no need to increase the thickness of the top oxide layer, so device miniaturization will not be restricted.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A method for fabricating a nitride read-only memory, comprising:
    forming a silicon oxide/silicon nitride/silicon oxide (ONO) stacked layer on a substrate, the ONO stacked layer consisting of a bottom oxide layer, a silicon nitride layer and a top oxide layer;
    forming a protective layer on the ONO stacked layer, the protective layer having a thickness smaller than 50 Å;
    patterning the protective layer and the ONO stacked layer to form a plurality of stacked patterns, wherein an etching rate of the protective layer is lower than an etching rate of the top oxide layer;
    performing an ion implantation to form a plurality of buried bit lines in the substrate between the stacked patterns;
    forming an insulator on each buried bit line; and
    forming a plurality of word lines on the substrate.

2. The method of claim 1, wherein a thickness of the bottom oxide layer is about 50~100 Å.

3. The method of claim 1, wherein a thickness of the silicon nitride layer is about 55~80 Å.

4. The method of claim 1, wherein a thickness of the top oxide layer is about 70~120 Å.

5. The method of claim 1, wherein the protective layer comprises silicon nitride.

6. The method of claim 1, wherein the insulator comprises silicon oxide.

7. The method of claim 1, wherein the word lines comprise polysilicon.

8. The method of claim 1, wherein the ONO stacked layer is patterned until a portion of the bottom oxide layer is exposed.

9. The method of claim 8, wherein the exposed bottom oxide layer is removed after the ion implantation is performed.

10. The method of claim 1, wherein a thickness of the protective layer is smaller than 50 Å.

* * * * *